(12) United States Patent
Buchine et al.

(10) Patent No.: US 10,692,971 B2
(45) Date of Patent: Jun. 23, 2020

(54) PROCESS FOR FABRICATING SILICON NANOSTRUCTURES

(71) Applicant: Advanced Silicon Group, Inc., Lincoln, MA (US)

(72) Inventors: Brent A. Buchine, Watertown, MA (US); Marcie R. Black, Lincoln, MA (US); Faris Modawar, Orem, UT (US)

(73) Assignee: Advanced Silicon Group, Inc., Lincoln, MA (US)

( * ) Notice: Subject to any disclaimer, the term of this patent is extended or adjusted under 35 U.S.C. 154(b) by 0 days.

(21) Appl. No.: 16/054,457

(22) Filed: Aug. 3, 2018

(65) Prior Publication Data

US 2018/0350908 A1 Dec. 6, 2018

Related U.S. Application Data

(60) Continuation of application No. 15/826,005, filed on Nov. 29, 2017, now abandoned, which is a division of
(Continued)

(51) Int. Cl.
*H01L 21/306* (2006.01)
*H01L 29/06* (2006.01)
(Continued)

(52) U.S. Cl.
CPC .......... *H01L 29/0669* (2013.01); *B01J 20/10* (2013.01); *B01J 20/28007* (2013.01);
(Continued)

(58) Field of Classification Search
CPC ........... H01L 29/0669; H01L 31/02363; H01L 31/028; H01L 31/0352; H01L 21/02118; H01L 21/02164; H01L 21/02175; H01L 21/02244; H01L 21/02282; H01L 21/02307; H01L 21/0234; H01L 21/02488; H01L 21/02513; H01L 21/02532; H01L 21/02603; H01L 21/2855; H01L 21/28568; H01L 21/32134; H01L 29/04;
(Continued)

(56) References Cited

U.S. PATENT DOCUMENTS

| 4,540,843 A | 9/1985 | Gochermann et al. |
| 4,589,191 A | 5/1986 | Green et al. |

(Continued)

FOREIGN PATENT DOCUMENTS

| CN | 1693191 A | 11/2005 |
| EP | 0039020 A2 | 11/1981 |

(Continued)

OTHER PUBLICATIONS

A. Luque, A. Marti, "Increasing the Efficiency of Ideal Solar Cells by Photon Induced Transitions at Intermediate Levels," Phys. Rev. Lett. 78(26)(1997) 5014-5017.
(Continued)

*Primary Examiner* — Selim U Ahmed
(74) *Attorney, Agent, or Firm* — Lando & Anastasi, LLP

(57) ABSTRACT

A process for etching a substrate comprising polycrystalline silicon to form silicon nanostructures includes depositing metal on top of the substrate and contacting the metallized substrate with an etchant aqueous solution comprising about 2 to about 49 weight percent HF and an oxidizing agent.

15 Claims, 4 Drawing Sheets

Related U.S. Application Data application No. 14/924,273, filed on Oct. 27, 2015, now Pat. No. 9,859,366, which is a continuation of application No. 14/444,361, filed on Jul. 28, 2014, now Pat. No. 9,202,868, which is a continuation of application No. 13/305,649, filed on Nov. 28, 2011, now Pat. No. 8,791,449, which is a continuation of application No. 12/423,623, filed on Apr. 14, 2009, now Pat. No. 8,143,143.

(60) Provisional application No. 61/141,082, filed on Dec. 29, 2008, provisional application No. 61/044,573, filed on Apr. 14, 2008.

(51) Int. Cl.

| | | |
|---|---|---|
| *B01J 20/10* | (2006.01) | |
| *B01J 20/28* | (2006.01) | |
| *B82Y 20/00* | (2011.01) | |
| *B82Y 30/00* | (2011.01) | |
| *H01L 21/308* | (2006.01) | |
| *H01L 31/0236* | (2006.01) | |
| *H01M 4/134* | (2010.01) | |
| *H01M 4/36* | (2006.01) | |
| *H01M 4/38* | (2006.01) | |
| *H01L 29/16* | (2006.01) | |
| *C23C 14/34* | (2006.01) | |
| *H01L 21/02* | (2006.01) | |
| *H01L 21/285* | (2006.01) | |
| *H01L 21/3213* | (2006.01) | |
| *H01L 29/04* | (2006.01) | |
| *H01L 31/028* | (2006.01) | |
| *H01L 31/0352* | (2006.01) | |
| *H01M 4/04* | (2006.01) | |
| *H01M 4/1395* | (2010.01) | |
| *H01M 4/66* | (2006.01) | |
| *H01M 10/0525* | (2010.01) | |
| *H01M 4/02* | (2006.01) | |

(52) U.S. Cl.
CPC ............ *B82Y 20/00* (2013.01); *B82Y 30/00* (2013.01); *C23C 14/34* (2013.01); *H01L 21/0234* (2013.01); *H01L 21/02118* (2013.01); *H01L 21/02164* (2013.01); *H01L 21/02175* (2013.01); *H01L 21/02244* (2013.01); *H01L 21/02282* (2013.01); *H01L 21/02307* (2013.01); *H01L 21/02488* (2013.01); *H01L 21/02513* (2013.01); *H01L 21/02532* (2013.01); *H01L 21/02603* (2013.01); *H01L 21/2855* (2013.01); *H01L 21/28568* (2013.01); *H01L 21/3086* (2013.01); *H01L 21/30604* (2013.01); *H01L 21/32134* (2013.01); *H01L 29/04* (2013.01); *H01L 29/0676* (2013.01); *H01L 29/16* (2013.01); *H01L 31/028* (2013.01); *H01L 31/0236* (2013.01); *H01L 31/02363* (2013.01); *H01L 31/0352* (2013.01); *H01M 4/0492* (2013.01); *H01M 4/134* (2013.01); *H01M 4/366* (2013.01); *H01M 4/386* (2013.01); *H01M 4/1395* (2013.01); *H01M 4/661* (2013.01); *H01M 10/0525* (2013.01); *H01M 2004/027* (2013.01); *Y02E 10/50* (2013.01); *Y10S 977/762* (2013.01)

(58) Field of Classification Search
CPC . H01L 29/16; H01L 29/0676; H01L 31/0236; H01L 21/3086; H01L 21/30604; H01M 4/0492; H01M 4/386; H01M 4/366; H01M 4/134; H01M 2004/027; H01M 10/0525; H01M 4/661; H01M 4/1395; C23C 14/34; B01J 20/10; B01J 20/28007; B82Y 30/00; B82Y 20/00; Y10S 977/762; Y02E 10/50

See application file for complete search history.

(56) References Cited

U.S. PATENT DOCUMENTS

| | | |
|---|---|---|
| 5,178,685 A | 1/1993 | Borenstein et al. |
| 5,221,854 A | 6/1993 | Banerjee et al. |
| 6,063,695 A | 5/2000 | Lin et al. |
| 6,177,291 B1 | 1/2001 | Eriguchi et al. |
| 6,334,939 B1 | 1/2002 | Zhou et al. |
| 6,514,395 B2 | 2/2003 | Zhou et al. |
| 6,534,336 B1 | 3/2003 | Iwane et al. |
| 6,649,824 B1 | 11/2003 | Den et al. |
| 7,265,037 B2 | 9/2007 | Yang et al. |
| 7,273,732 B2 | 9/2007 | Pan et al. |
| 7,816,031 B2 | 10/2010 | Cui et al. |
| 8,143,143 B2 | 3/2012 | Buchine et al. |
| 8,450,599 B2 | 5/2013 | Buchine et al. |
| 8,491,718 B2 | 7/2013 | Chaudhari |
| 8,791,449 B2 | 7/2014 | Buchine et al. |
| 9,202,868 B2 | 12/2015 | Buchine et al. |
| 2002/0079290 A1 | 6/2002 | Holdermann |
| 2003/0178057 A1 | 9/2003 | Fujii et al. |
| 2004/0005723 A1 | 1/2004 | Empedocles et al. |
| 2004/0245912 A1 | 12/2004 | Thurk et al. |
| 2005/0074917 A1 | 4/2005 | Mason et al. |
| 2005/0200020 A1 | 9/2005 | Kamins |
| 2006/0101944 A1 | 5/2006 | Petrini et al. |
| 2006/0207647 A1 | 9/2006 | Tsakalakos et al. |
| 2006/0216603 A1 | 9/2006 | Choi |
| 2007/0107103 A1 | 5/2007 | Kempa et al. |
| 2007/0148975 A1 | 6/2007 | Mascolo et al. |
| 2007/0190542 A1 | 8/2007 | Ling et al. |
| 2007/0278476 A1 | 12/2007 | Black |
| 2007/0289623 A1 | 12/2007 | Atwater |
| 2008/0006319 A1 | 1/2008 | Bettge et al. |
| 2008/0038467 A1 | 2/2008 | Jagannathan et al. |
| 2008/0169017 A1 | 7/2008 | Korevaar et al. |
| 2010/0092888 A1 | 4/2010 | Buchine et al. |
| 2010/0122725 A1 | 5/2010 | Buchine et al. |

FOREIGN PATENT DOCUMENTS

| | | |
|---|---|---|
| JP | 2005059125 A | 3/2005 |
| KR | 100809248 B1 | 2/2008 |
| WO | 2008047847 A1 | 4/2008 |
| WO | 2010056352 A2 | 5/2010 |

OTHER PUBLICATIONS

C. Chan et al., "High-performance lithium battery anodes using silicon nanowires," Nature Nanotechnology 3, 31-35 (2008).
Candace K. Chan et al., "Structural and electrochemical study of the reaction of lithium with silicon nanowires," Journal of Power Sources 189, 34-39 (2009).
H. Asoh, F. Arai, S. Ono, "Site-selective chemical etching of silicon using patterned silver catalyst," Electrochem. Comm. 9 (2007) 535.
H. Fang, Y. Wu, J. Zhao, and J. Zhu, "Silver catalysis in the fabrication of silicon nanowire arrays," Nanotechnology 17 (2006) 3768.
K. Peng, J. Hu, Y. Yan, Y. Wu, H. Fang, Y. Xu, S. Lee, and J. Zhu, "Fabrication of Single-Crystalline Silicon Nanowires by Scratching a Silicon Surface with Catalytic Metal Particles." Adv. Funct. Mat. 16(2006) 387.
K. Peng, J. Jie, W. Zhang, S. Lee, "Silicon nanowires for rechargeable lithium-ion battery anodes." App. Phys. Lett., 93, 033105 (2008).
K. Peng, M. Zhang, A. Lu, N. Wong, R. Zhang, S. Lee, "Ordered silicon nanowire arrays via nanosphere lithography and metal-induced etching." App. Phys. Lett. 90(2007) 163123.

(56) References Cited

OTHER PUBLICATIONS

K. Peng, Y. Xu, Y. Wu, Y. Yan, S. Lee, J. Zhu, "Aligned Single-Crystalline Si Nanowire Arrays for Photovoltaic Applications," Small, 1(11)(2005) 1062-1067.

K. Peng, Z. Huang, and J. Zhu, "Fabrication of Large Area Silicon Nanowire p-n Junction Arrays." Adv. Mater. 16(1) (2004) 73-76.

Koynov et al., "Black multi-crystalline silicon solar cells", Phys. Stat. Sol. (RRL), 1, No. 2, R53-R55 (2007).

Koynov et al., "Black nonreflecting silicon surfaces for solar cells", Applied Physics Letters, 88, 203107 (2006).

L. Tsakalakos, J. Balch, J. Fronheiser et al. "Silicon nanowire solar cells," App. Phys. Lett. 91(23) (2007) 233117.

Li-Feng Cui et al., "Crystalline-Amorphous Core-Shell Silicon Nanowires for High Capacity and High Current Battery Electrodes," Nano Letters 9, 491-495 (2009).

M. D. Kelzenberg, D. B. Turner-Evans, B. M. Kayes et al., "Photovoltaic Measurements in Single-Nanowire Silicon Solar Cells." Nano Lett. 8(2)(2008) 710-714.

Q. Shao, A. A. Balandin et al., "Intermediate-band solar cells based on quantum dot supracrystals." App. Phys. Lett. 91 (2007)163503.

S. Panero, B. Scrosati, M. Wachtler et al., "Nanotechnology for the progress of lithium batteries R&D." J. of Power Sources 129(2004) 90-95.

T. Qiu, X. L. Wu, X. Yang, G. S. Huang, and Z. Y. Zhang, "Self-assembled growth and optical emission of silver-capped silicon nanowires." App. Phys. Lett., 84(19)(2004) 3867.

T.L. Kulova et al., "The Li Insertion/Extraction Characteristics of Amorphous Silicon Thin Films," Chem. Biochem. Engl. Q. 21, 83-92(2007).

Uday Kassavajjula et al., "Nano- and bulk-silicon-based insertion anodes for lithium-ion secondary cells," Journal of Power Sources 163, 1003-1039 (2007).

Y. Cui et al., "Diameter-controlled synthesis of single-crystal silicon nanowires." App. Phys. Lett. 78(2001) 2214-2216.

Y. Yang, P. Chu, Z. Wu, S. Pu, T. Hung, K. Huo, G. Qian, W. Zhang, X. Wu, "Catalysis of dispersed silver particles on directional etching of silicon," Appl. Surf. Sci 254 (2008) 3061.

Z. Huang et al. Fabrication of Silicon Nanowire Arrays with Controlled Diameter, Length, and Density; Adv. Mater. 2007, 19, 744-748; Published online: Feb. 7, 2007.

Z. Huang, J. Carey, M. Liu, X. Guo, E. Mazur, J. Campbell, "Microstructured silicon photodetector", Appl. Phys. Lett. 89, 033506 (2006).

Black et al., "Optical Properties of Bismuth Nanowires," Encyclopedia of Nanoscience and Nanotechnology, 2011, vol. 10, pp. 225-242.

Chaudhari, P. et al., Heteroepitaxial Silicon Film Growth at 600C From an Al-Si Eutectic Melt, pp. 5368-5371, Mar. 19,2010, Thin Solid Films 518, Elsevier, US.

Examination Report from corresponding Indian Application No. 3312/CHENP/2011 dated Apr. 11, 2018.

Extended European Search Report for Corresponding Application.: EP09826444 dated Apr. 11, 2016.

Franssila, "Introduction to Microfabrication," 2004, John Wiley & Sons Ltd., ISBN 978-0-470-85105-0, 391 pages.

Garnett EC, Yang P. Silicon nanowire radial p-n junction solar cells, J Am Chem Soc. Jul 23, 2008; 130(29):9224-5.

Goncher G et al. PN junctions in silicon nanowires, J Electronic Materials 35:1509-1512, 2006.

Gray, "Chapter 3. The Physics of the Solar Cell," Handbook of Photovoltaic Science and Engineering, 2003, pp. 61-112.

Green, "Chapter 10. Silicon Solar Cells, Advanced Principles & Practice," Centre for Photovoltaic Devices and Systems, Mar. 1995, ISBN 0733409946, 35 pages.

Hagglund C et al. Enhanced charge carrier generation in dye sensitized solar cells by nanoparticle plasmons. Appl Phys Lett 92(1):013113-013113-3, 2008.

Heidel, TD et al. Surface plasmon polariton mediated energy transfer in organic photovoltaic devices, Appl Phys Lett 91(9):093506-093506-3, 2007.

Kayes BM, Atwater HA. Comparison of the device physics priciples of planar and radial p-n junction nanorod solar cells, J Appl Phys 97:114302, 1-11, 2005.

Kelzenberg et al., "Single-Nanowire Si Solar Cells", California Institute of Technology, 2008 IEEE, 6 pgs.

Kirkengen M et al. Direct generation of charge carriers in c-Si solar cells due to embedded nanoparticles, J Appl Phys 102(9):0937131, 1-5 (2007).

Kuiqing Peng et al. "Aligned Single-Crystalline Si Nanowire Arrays for Photovoltaic Applications", Small 1 (11):1062-1067, 2005.

Liu et al. "A promising p-type transparent conducting material: Layered oxysulfide tCu2S2ttSr3Sc205t", Journal of Applied Physics 102, 116108 (2007).

Olson et al., "Chapter 9. High-Efficiency IIII-V Multijunction Solar Cells," Handbook of Photovoltaic Science and Engineering, 2003, pp. 359-411.

Peng et al., "Motility of Metal Nanoparticles in Silicon and Induced Anisotropic Silicon Etching", Advanced Functional Materials, vol. 18, 2008, pp. 3026-3035.

Peng K et al., "Fabrication of Single-Crystalline Silicon Nanowires by Scratching a Silicon Surface with Catalytic Metal Particles," Advanced Functional Materials, 2006, 16, pp. 387-394.

Tsakalakos et al., "Silicon Nanowire Solar Cells", Applied Physics Letters, Letter 91—233117, 2007, pp. 1-3.

PROCESS FOR FABRICATING SILICON NANOSTRUCTURES

CROSS-REFERENCE TO RELATED APPLICATIONS

This application claims priority under 35 U.S.C. § 120 as a continuation of U.S. patent application Ser. No. 15/826,005, filed Nov. 29, 2017, titled "PROCESS FOR FABRICATING SILICON NANOSTRUCTURES," which is a division of U.S. patent application Ser. No. 14/924,273, filed Oct. 27, 2015, titled "PROCESS FOR FABRICATING SILICON NANOSTRUCTURES," which is a continuation of U.S. patent application Ser. No. 14/444,361, filed Jul. 28, 2014, titled "PROCESS FOR FABRICATING NANOWIRE ARRAYS," now U.S. Pat. No. 9,202,868, which is a continuation of U.S. patent application Ser. No. 13/305,649, filed Nov. 28, 2011, titled "NANOSTRUCTURED SILICON FOR BATTERY ANODES," now U.S. Pat. No. 8,791,449, which is a continuation of U.S. patent application Ser. No. 12/423,623, filed Apr. 14, 2009, titled "PROCESS FOR FABRICATING NANOWIRE ARRAYS," now U.S. Pat. No. 8,143,143, which claims priority to U.S. Provisional Applications Nos. 61/044,573, filed Apr. 14, 2008, and 61/141,082, filed Dec. 29, 2008. These applications are incorporated by reference herein.

TECHNICAL FIELD

This application pertains to the field of nanotechnology.

BACKGROUND OF THE INVENTION

The ability to structure and pattern silicon is important for many applications. There has been particular interest in patterning silicon to make nanostructures. Relevant information regarding silicon fabrication processes known to those of skill in the art can be found, for example, in Sami Franssila, *Introduction to Microfabrication* (John Wiley & Sons, 2004), and the references cited there.

Semiconductor nanowires have become the focal point of research over the last decade due to their interesting physical, chemical and biological properties. There is particular interest surrounding silicon nanowires, as silicon is one of the most abundant materials in the earth's crust and has become a cornerstone for many of the electronic, optoelectronic, electro-chemical and electro-mechanical devices upon which designs are based.

Today, many nanosystems are not utilized commercially due to the large cost associated with fabrication, and limitations in the scalability of nanowire synthesis. Nanowires have been grown bottom up using molecular beam epitaxy (MBE), metal-organic chemical vapor deposition (MOCVD), and physical vapor deposition (PVD). They have also been fabricated top-down using techniques like reactive ion etching (RIE) and inductively coupled plasma (ICP). These systems require high temperature and/or low pressure which is largely responsible for the high cost. A push towards solution based techniques that can be operated in ambient conditions is important given their low cost, simplicity of design and ease of utilization.

Recent work has demonstrated the fabrication of silicon nanowires using a solution made up of a metal salt and a strong acid (typically $AgNO_3$ and HF). (See reference (a).) By controlling the concentrations of each component in solution, silicon can be etched normal to the plane of the wafer forming vertically aligned silicon nanowires with an average diameter of 150 nm and a diameter range from 20-300 nm. Through the realization that silver is precipitating out of solution and catalyzing the silicon etch, the technique has been modified to incorporate the addition of $H_2O_2$ into the chemical bath and Ag metal directly deposited onto silicon. Polystyrene spheres of uniform dimensions were dispersed prior to the deposition of the Ag in order to use them as an etch mask and define the nanowire. (See reference (e).) As a result, ordered arrays of silicon nanowires with a homogeneous diameter and length were demonstrated.

The ultimate diameter achieved with this technique has been limited. The ability to achieve sub-100 nm dimensions is of value to a variety of electronic, optoelectronic, electrochemical and electromechanical applications. For example, it is within the sub-100 nm range that silicon begins to demonstrate novel properties distinguishable from the properties of bulk silicon. In addition, an increase in surface area at the low nanometer scale is of value.

SUMMARY OF THE INVENTION

A process is provided for etching a silicon-containing substrate to form nanowire arrays. In this process, one deposits nanoparticles and a metal film onto the substrate in such a way that the metal is present and touches silicon where etching is desired and is blocked from touching silicon or not present elsewhere. One submerges the metallized substrate into an etchant aqueous solution comprising HF and an oxidizing agent. In this way arrays of nanowires with controlled diameter and length are produced.

DETAILED DESCRIPTION OF THE INVENTION

In an aspect of the invention, a process is provided for etching a silicon-containing substrate to form nanostructures. In this process, one deposits and patterns a metal film onto the substrate in such a way that the metal is present and touches silicon where etching is desired and is blocked from touching silicon or not present elsewhere. One submerges the metallized substrate into an etchant aqueous solution comprising about 4 to about 49 weight percent HF and an oxidizing agent.

In a process as described above, to achieve sub-100 nm nanowires, one may use sub-100 nm nanoparticles to block the silver from the silicon. The nanoparticles may be made of a variety of substances, for example silicon dioxide, iron oxide, or polymers.

A. First Exemplary Process

Figure 1:
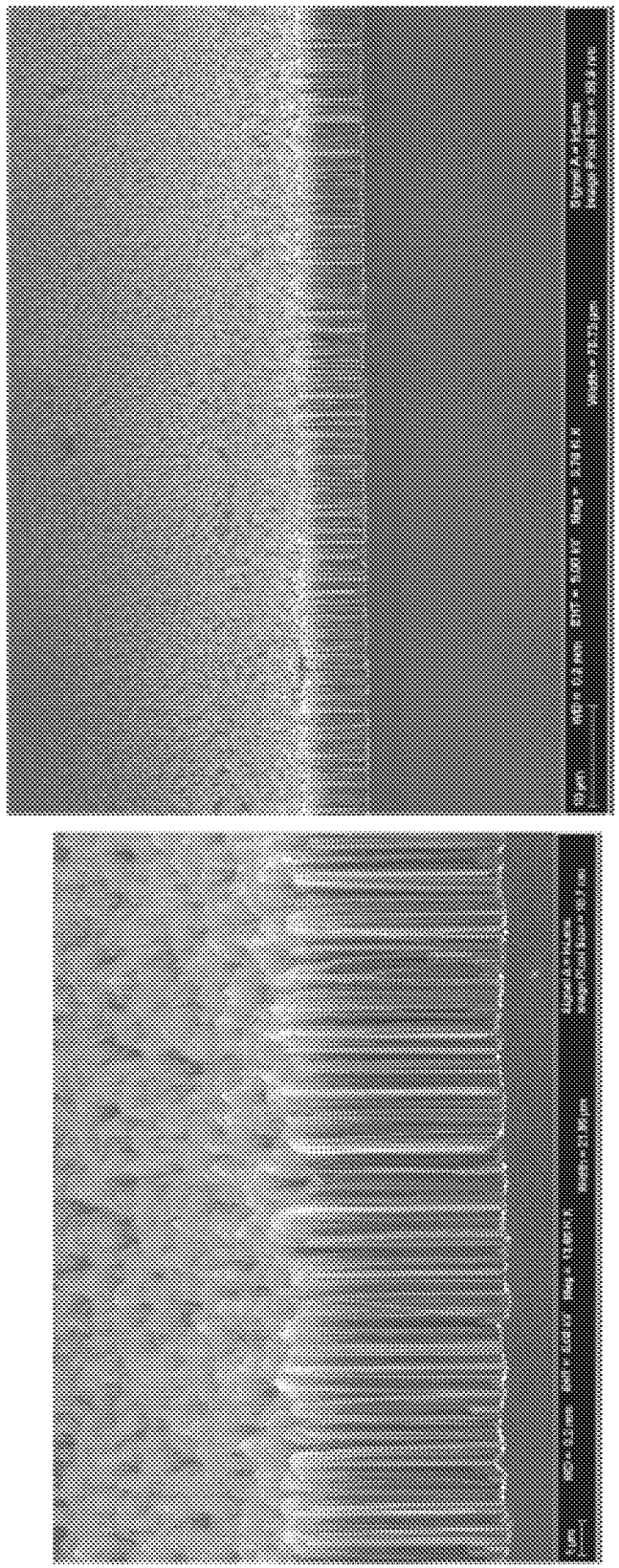
FIG. 1 depicts the result of using an embodiment of the invention to obtain nanowires with diameters that ranged from 12-70 nm.

An exemplary process utilizes the spinning of $SiO_2$ nanoparticles well dispersed in an isopropanol solution (5 wt % $SiO_2$ in IPA) that ranged in particle size from 12-30 nm at 4000 RPM. Subsequent to spin-coating, the samples were heated at elevated temperatures resulting in solvent evaporation. Once the samples were dry, 40 nm of Ag was sputter deposited on top in order to coat the $SiO_2$ nanoparticles as well as the bare silicon spaces in between. The samples were dipped into an $HF/H_2O_2$ solution for a period of 10 minutes. The etching reaction commenced at the Ag/Si interface and the nanoparticles acted as a barrier by which to mask and define the nanostructure. The dimensions of the nanoparticles, which are selected per the desired application, influence the dimensions and the shape of the resulting one-dimensional nanostructure. Some agglomeration occurred between the $SiO_2$ nanoparticles resulting in wire dimensions on the order of a single agglomerate. By selecting the concentration of particles in solution as well as the method for depositing/spin coating the particles, it is possible to limit agglomeration resulting in nanowires that ranged from 12-70 nm. A result is depicted in FIG. 1.

B. First Alternative

In a variant on the process described above, one uses iron oxide nanoparticles (5-10 nm) with surfaces that have been pretreated with oleic acid and dispersed in chloroform. This surface treatment was done in order to prevent agglomeration and maintain a stable nanoparticle suspension. In this situation it was not necessary to spin coat. Deposition of the nanoparticles onto the silicon substrate was achieved by applying a few drops of the solution to the surface under static conditions (no spinning) Rapid evaporation at room temperature resulted in a monodispersed layer of the iron oxide particles on the silicon substrate with little to no agglomeration. Without wishing to be bound by theory, it is believed that the monodispersed layer resulted at least in part from the pre-tailored surface tension properties and the high vapor pressure of the solvent.

Figure 2:
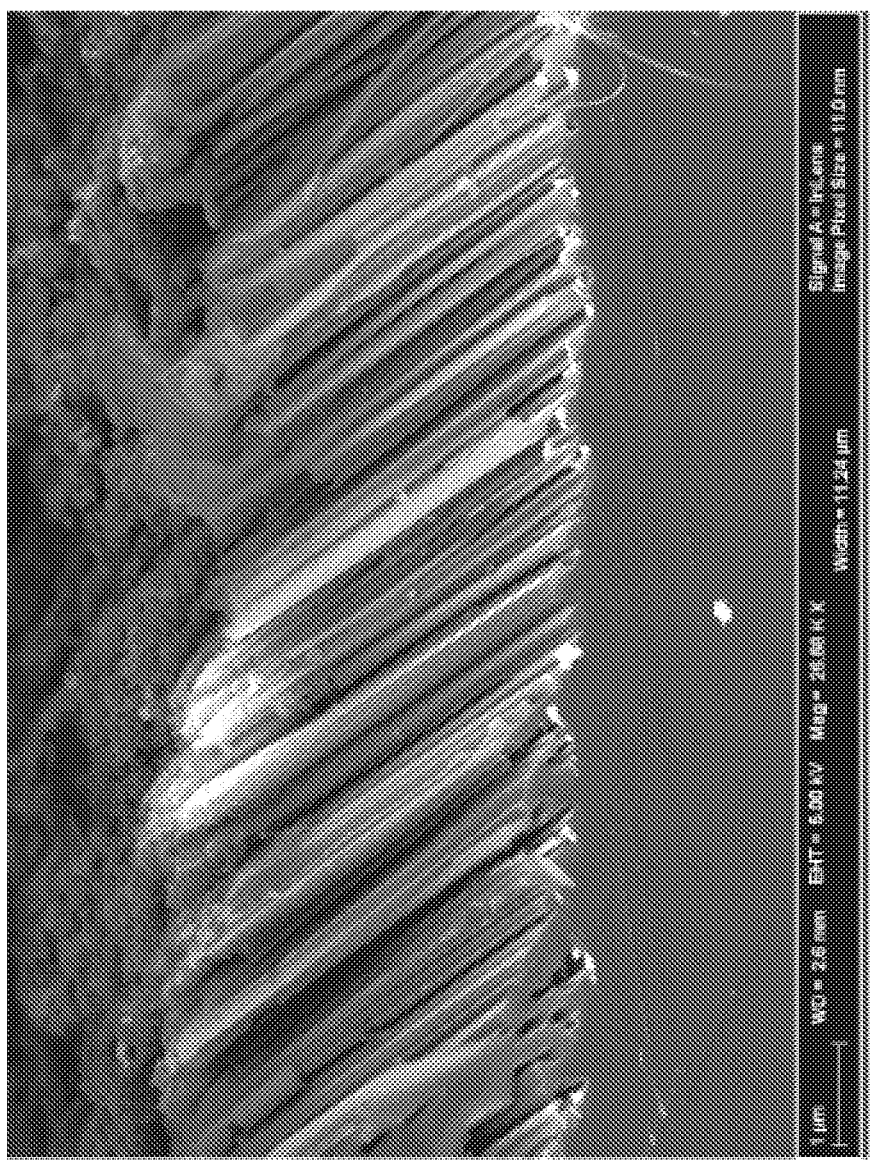
FIG. 2 depicts the result of using the alternative embodiment described below in part B to obtain nanowires.

In this alternative process, Ag was sputter deposited on the surface and the substrate to coat the iron oxide particles and the spaces in between. The sample was dipped into a similar $HF/H_2O_2$ solution in order to begin the etching reaction and form the nanowires. An example of the result is seen in FIG. 2. There is some bundling that occurs due to the drying process, making it difficult to determine precisely the actual nanowire dimension. However, all of the measurable structures had a diameter less than 30 nm.

C. Second Alternative

In a further variation of the process, other oxidizers may be used in place of $H_2O_2$ in the $H_2O_2$—HF etchant solution. An oxidizing agent (also called an oxidant or oxidizer) is a substance that readily transfers oxygen atoms or tends to gain electrons in a redox chemical reaction. One such oxidizer is pure oxygen, which may be introduced by bubbling oxygen through the HF. Other oxidizers include: ozone, chlorine, iodine, ammonium perchlorate, ammonium permanganate, barium peroxide, bromine, calcium chlorate, calcium hypochlorite, chlorine trifluoride, chromic acid, chromium trioxide (chromic anhydride), peroxides such as hydrogen peroxide, magnesium peroxide, dibenzoyl peroxide and sodium peroxide, dinitrogen trioxide, fluorine, perchloric acid, potassium bromate, potassium chlorate, potassium peroxide, propyl nitrate, sodium chlorate, sodium chlorite, and sodium perchlorate.

It may be desirable to use a less reactive alternative oxidizer in place of $H_2O_2$. Comparative reactivity towards the metal deposited (e.g., silver), silicon, or silicon dioxide may be of interest in the selection of an oxidizer. Reactivity may be measured, for example, by the extent to which the reaction goes forward in a particular period of time, or by determining a reaction rate as discussed in books on physical chemistry and chemical kinetics. (See, e.g., Peter W. Atkins & Julio de Paula, Atkins' Physical Chemistry (8th ed. 2006), especially chapters 22 and 23.) Measurements may be made in conditions such as temperature and pressure similar to those of the etching process.

An exemplary process would be as follows:

Silicon material with a resistivity of greater than 20 ohm-cm is selected having a surface with (100), (110), (111) or any orientation available. Amorphous and/or microcrystalline material will also result in vertically oriented nanowires if one carries out the following process.

The substrate is pre-cleaned using a series of solvents by sonicating for three minutes each in acetone, methanol and then isopropyl alcohol. The substrate is then rinsed in a dump-tank of flowing deionized water (DI) for 3 minutes to remove any residue remaining from the solvent clean. The silicon is placed into a Piranha solution made up of 3 parts 96% $H_2SO_4$ and 1 part 30 wt % $H_2O_2$ for 15 minutes in order to remove any additional organics and create a hydrophilic surface. The substrate is then removed from the bath and placed into a dump dank of flowing DI water again for 3 minutes to remove any residual acids. The substrate is removed and blown dry with nitrogen gas.

A colloidal suspension of 10 nm iron oxide nanoparticles in chloroform is made by diluting product # SOR-10-0050 from OceanNanotech to a concentration of 1 mg/mL. The silicon wafer is coated with the iron oxide by dipping the silicon into the colloidal suspension and then removing the substrate so that the surface normal is perpendicular to the vertical direction of motion allowing the chloroform to sheet of the surface. The combination of the hydrophilic surface and the nature of the oleic acid functionalized iron oxide nanoparticles, results in a natural self-assembly that limits agglomeration and gives some reasonable spacing to the particles. The samples are then baked on an 80° C. hot plate for 2 minutes and cleaned using an in-situ $O_2$ plasma prior to metal deposition.

In addition to iron oxide nanoparticles, 100 nm polystyrene spheres have also been used successfully in this process. In this situation, a hydrophilic surface is created on the silicon substrate as described above. The polystyrene spheres (purchased from Duke Scientific Corporation) are diluted to a concentration of 1% and spun onto the substrate at 500 RPM for 5 seconds followed by a ramp to 2000 RPM for 40 seconds. The polystyrene spheres create a single monolayer on the surface. An $O_2$ plasma is used to reduce the size and spacing in the polystyrene spheres inside a plasma stripper prior to inserting the sample into the metal deposition tool (30 W, 200 mTorr). The sample heats up during the plasma clean, which can change the properties (or melt) the polystyrene making it difficult to continue the shrinking process. To resolve this, the polystyrene is etched using short 1 minute intervals, removing the substrate from the tool and allowing it to cool to room temperature prior to the next 1 minute etch. Preferably the shrinking process is done in-situ (inside the metal deposition tool) prior to metal deposition with Ar or $O_2$.

Silver (Ag) is deposited via physical vapor deposition inside a sputterer, thermal evaporator or e-beam evaporator. It is desirable that a continuous film results, where there are no breaks or cracks that would cause a portion of the film to become isolated from the remainder. As HF concentration is altered, the optimal film thickness may need to be varied.

Once the chip is coated with the appropriate film of Ag, the HF solution is seasoned before commencing the etching reaction. The concentration of HF can vary from full strength (about 49 wt %) all the way down to very nominal concentrations. Initial observations have shown that the length of the resulting nanostructure increases as HF concentration is reduced. Concentrations as low as 2 wt % and below may be used. For example, a solution of 8 wt % HF may be used.

$O_2$ gas is flowed into the bath to create a vigorous bubbling for a period of 10 minutes. Once the bath is seasoned, the samples are submerged. At the completion of the etch, the samples are removed and put into a dump-tank of flowing DI water and blown dry with $N_2$. At this point the remaining Ag on the surface can be removed with a silver etchant, for example the etchant supplied by Transene Corporation.

Figure 3:
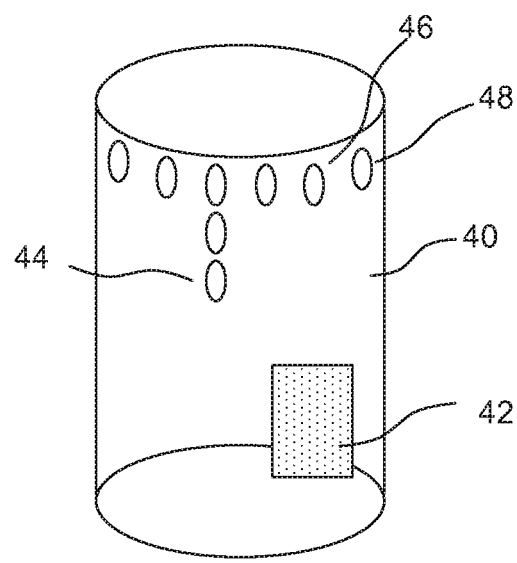
FIG. 3 depicts schematically a setup for practicing processes of the invention, using oxygen as an oxidizer.

FIG. 3 depicts a setup for the use of oxygen gas as an oxidizer. There is a container holding HF etchant 40. In the container there is a silver/silicon substrate 42. There is an oxygen source 44 which produces oxygen bubbles such as 46 and 48. The oxygen source inlet may be placed at, above, or below the level of the substrate. With this less aggressive oxidizer, all wires were formed by the intentional nanoparticle mask that was spun on top of the surface. No defects formed in the metal film during etching were apparent.

Figure 4:
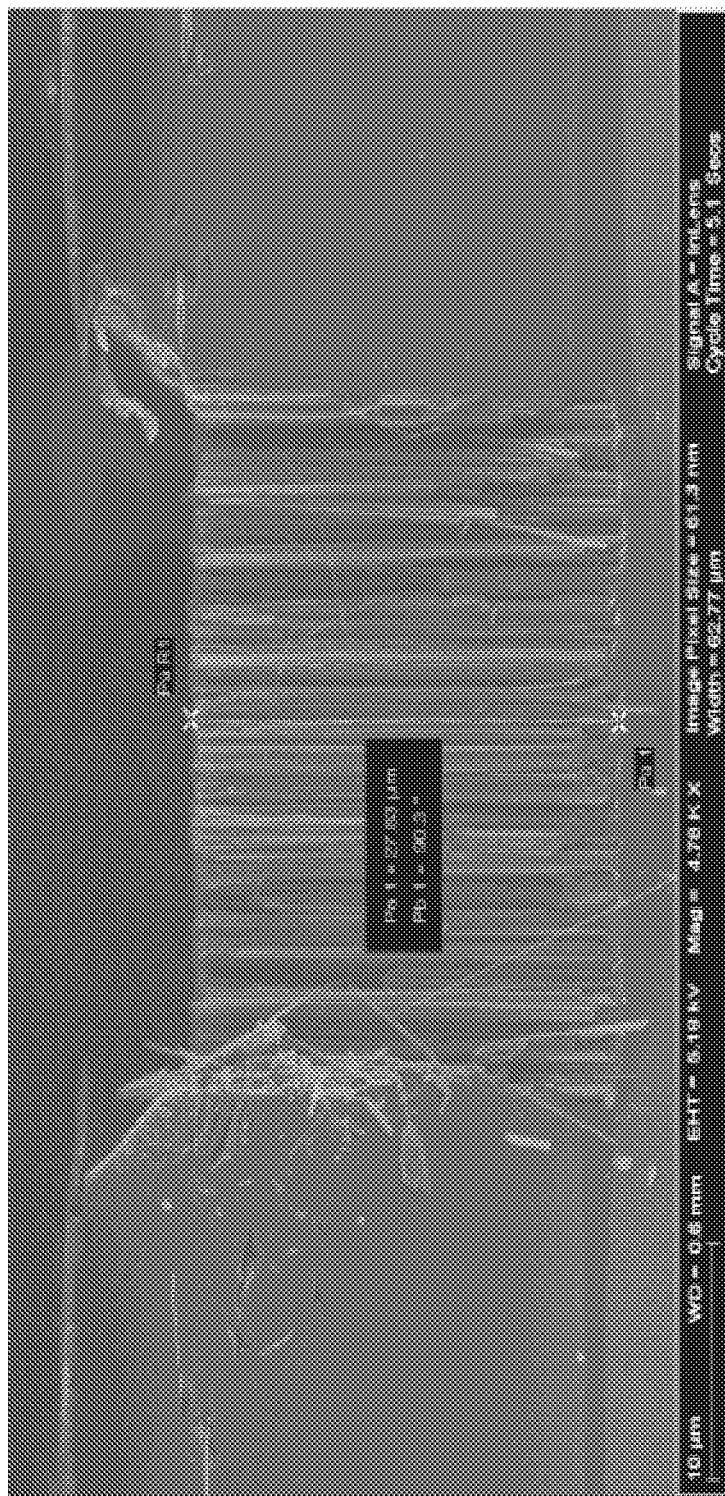
FIG. 4 depicts the result of using metal enhanced etching of silicon to obtain microstructuring on a silicon wafer. Unintentional wires were formed inside the trenches.

An advantage of the processes which use alternative oxidizers is that they are able to eliminate unintentional nanowires ("grass") formed in some variants of the processes described above, while still producing the desirable sub-100 nm nanowires while using a thin continuous layer of metal for catalyzed etching of silicon. FIG. 4 depicts unintentional nanowires. Avoidance of these unintentional nanowires both saves an etching step which would be used to eliminate them and also avoids the rounding of nanostructure corners and edges which would result from such an etching step.

While not wishing to be bound by theory, it is believed that some of the alternative oxidizers used in these processes of the invention do not attack the metal, or attack it to a much lesser degree than $H_2O_2$. This may be a reason why processes with alternative oxidizers avoid the formation of unintentional nanowires. For this reason it may be desirable to use oxidizers known to react less readily or at a lower rate with the metal than $H_2O_2$ does.

In order to avoid unintentional wires, it is desirable that the metal film be free of small unintentional holes and be deposited on a clean silicon surface free of oxide.

A further advantage of the processes of the invention is that they are extendable to specified crystallographic directions. With at least some processes of the invention, irrespective of the crystal orientation of the silicon surface, the nanowires will be etched at least approximately perpendicular to that surface. In order to achieve this, it is desirable that the metal film has no breaks or cracks that would cause a portion of the film to become isolated from the remainder. It is also desirable that the metal film has sufficient adhesion and is deposited on a clean silicon surface. Desirable angles between nanowire axes and a vector normal to the substrate may be, for example, less than about 0.25 degrees, about 0.5 degrees, about 1 degree, or about 2 degrees.

With processes of the invention, it is possible to make wires which have a noticeable taper that results in the wire diameter increasing slightly as the etch progresses. The taper has been found to increase with HF concentration. For some applications, the taper may not be desirable. For photovoltaic applications, however, a taper may be beneficial. For example, with a slight taper, free carriers in the nanowire will bounce off the edges of the wire and thus tend propagate downward to the substrate. If the p-n junction of the photovoltaic cell is in the substrate rather than in the nanowires, this increased diffusion towards the substrate may be expected to increase the cell efficiency. Desirable taper angles might be, for example, no more than about 0.5 degrees, about 1 degree, about 2 degrees, or about 4 degrees, or in a range between about 0.5 degrees and about 1 degree, about 2 degrees, or about 4 degrees.

Using processes of the invention it is possible to achieve nanowire diameters which are on average (e.g., have a mean or median) below about 150 nm, below about 125 nm, below about 100 nm, below about 70 nm, or below about 50 nm. Small nanowires are important in certain applications, such as where the small size changes the band structure of the silicon. It may be desired, for example, that a majority, or at least about 75%, or about 90%, or about 95% of the nanowires have diameters less than a selected dimension such as those indicated above.

D. Applications

Processes of the invention may be applied to structuring silicon for optoelectronic devices (see reference (i)). They may be employed in devices that utilize the photoelectric or photovoltaic effect, for example solar cells (see, e.g., references (j) and (k)), photodetectors, photodiodes (see reference (a)), phototransistors, photomultipliers and integrated optical circuits. Silicon nanowire arrays or individual nanowires fabricated via this process can be utilized within each of these applications.

Processes of the invention may be employed to produce devices made out of or comprising polycrystalline silicon. The invention encompasses processes which can be used with any crystalline orientation of silicon. Such processes can be used to texture the surface of and/or form nanowires in polysilicon. Polysilicon is a cheaper material than crystalline silicon, but it is typically more difficult to texture and structure than single crystal silicon due to the random orientation of the grains. The processes of the invention can likewise be used to form nanowires in amorphous silicon.

Arrays of silicon nanowires can be used in applications where the silicon will be subjected to stress or strain where the nanostructure is able to absorb and relax this stress or strain. For example, nanowires can act as an interfacial layer between bulk silicon and another material grown on top which is not lattice-matched to it.

Processes of the invention are also applicable to lithium ion battery technology. Silicon has been seen as a desirable candidate for the anode material in lithium ion batteries due to its low discharge potential and high charge capacity. Its application in the past has been limited due to the large change in volume associated with ion insertion and ion extraction. The large amounts of stress and strain that builds in the silicon results in degradation of the silicon layer resulting in a very short performance lifetime. Nanowires have been pursued due to their ability to withstand these stress and strains (see reference (1)). The ability to form well ordered and aligned nanostructures with a great deal of control over the resulting diameter and void spacing between them provided by processes of the invention would be advantageous in making a lithium ion battery anode. In addition, the fact that porous silicon (nanopores or micropores) can also be fabricated via processes of this invention would enable the fabrication of another anode geometry capable of withstanding the stresses and strains of ion insertion/extraction for lithium ion battery applications.

It would additionally be possible to form a porous template or silicon nanowire arrays out of a specific type of silicon (say n-type) and utilize an alternate technique like the vapor, liquid, solid (VLS) process to fill the pores with p-type silicon nanowires resulting in a novel n/p junction configuration which could be utilized in a wide variety of optoelectronic (LED, photovoltaic) and electronic (transistor) applications. (For some general information about the VLS process see reference (p).) This process is especially favorable since the Ag particles that catalyze the etching of the silicon substrate to form the template could also be used to catalyze the wire growth (e.g., in VLS or VSS) at the base of the pore to synthesize the wire. In addition, the Ag particles could serve as electrical contacts for the device. A wide variety of materials other than silicon can be formed inside the template as well. A few examples are Bi, Ge, GaN, ZnO, and GaAs.

Processes of the invention may be used to create nanostructures which make silicon into an intermediate band photovoltaic material (IBPV). (See reference (n).) Silicon has an excellent band structure for IBPV, provided that the strength of particular electronic transitions can be enhanced. One way to do this is to form a dense array of silicon nanowires with specific control over the wire diameter, doping and crystallographic orientation, as described in reference (i). Processes of the invention may be used for manufacturing such nanowire arrays.

The following references are of interest in relation to this application: (a) K. Peng, Z. Huang, and J. Zhu, *Adv. Mater.* 16 (1) (2004) 73-76; (b) T. Qiu, X. L. Wu, X. Yang, G. S. Huang, and Z. Y. Zhang, *App. Phys. Lett.*, 84 (19) (2004) 3867; (c) H. Fang, Y. Wu, J. Zhao, and J. Zhu, *Nanotechnology* 17 (2006) 3768 and Y. Yang, P. Chu, Z. Wu, S. Pu, T. Hung, K. Huo, G. Qian, W. Zhang, X. Wu, *Appl. Surf Sci.* 254 (2008) 3061 and X. Li and P. Bohn, *Appl. Phys. Lett.* 77 (16) (2000) 2572 and H. Asoh, F. Arai, S. Ono, *Electrochem. Comm.* 9 (2007) 535; (d) K. Peng, J. Hu, Y. Yan, Y. Wu, H. Fang, Y. Xu, S. Lee, and J. Zhu *Adv. Mat.* 16 (2006) 387; (e) Z. Huang, H. Fang, J. Zhu, *Adv. Fun. Mat.* 19 (2007) pg. 744; (f) K. Peng, M. Zhang, A. Lu, N. Wong, R. Zhang, S. Lee, *App. Phys. Lett.* 90 (2007) 163123; (g) U.S. Provisional Patent Application No. 61/044,573, filed Apr. 14, 2008; (h) U.S. Provisional Patent Application No. 61/195,872, filed Oct. 9, 2008; (i) U.S. Patent Application Publication No. 2007/0278476, filed Feb. 27, 2007; (j) L. Tsakalakos, J. Balch, J. Fronheiser et al. *App. Phys. Lett.* 91 (23) (2007) 233117; (k) M. D. Kelzenberg, D. B. Turner-Evans, B. M. Kayes et al., *Nano Lett.* 8 (2) (2008) 710-714; (l) C. K. Chan, H. Peng, G. Liu, K. McIlwrath, X. F. Zhang, R. A. Huggins, and Y. Cui *Nature Nanotech.* 3 (2008) 31-35; (m) U.S. Published Patent Application No. 2007/0190542, filed Oct. 3, 2006; (n) A. Luque, A. Marti, *Phys. Rev. Lett.* 78 (26) (1997) 5014-5017; (o) Q. Shao, A. A. Balandin, *App. Phys. Lett.* 91 (2007) 163503; (p) Y. Cui et al., *App. Phys. Lett.* 78 (2001) 2214-2216.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

What is claimed is:

1. A process for etching a substrate comprising polycrystalline silicon to form polycrystalline silicon nanostructures, the process comprising:
   depositing metal on top of the substrate; and
   contacting the metallized substrate with an etchant aqueous solution comprising about 2 to about 49 weight percent HF and an oxidizing agent; and
   forming a p-n junction within the substrate.

2. The process of claim 1, further comprising selecting a method of metal deposition and selecting the oxidizing agent such that the process results in formation of an array of nanostructures oriented substantially vertically relative to the top of the substrate.

3. The process of claim 2, further comprising selecting the method of metal deposition and selecting the oxidizing agent such that the process results in formation of nanostructured arrays in which an average diameter of the nanostructures is less than about 125 nm.

4. The process of claim 1, further comprising selecting a method of metal deposition and selecting the oxidizing agent such that the process results in formation of nanostructures oriented substantially and approximately perpendicular to the top of the substrate.

5. The process of claim 1, wherein depositing the metal comprises depositing the metal as a continuous film.

6. The process of claim 1, wherein the oxidizing agent is oxygen gas and the process further comprises bubbling the oxygen gas through the etchant aqueous solution.

7. The process of claim 1, wherein the metal deposited on top of the substrate is silver.

8. The process of claim 7, wherein the silver is deposited by a solution made up of a metal salt.

9. The process of claim 7, wherein the silver is deposited as a continuous film.

10. The process of claim 1, wherein the oxidizing agent is hydrogen peroxide.

11. The process of claim 1, wherein the oxidizing agent is one or more of oxygen, ozone, chlorine, iodine, ammonium perchlorate, ammonium permanganate, barium peroxide, bromine, calcium chlorate, calcium hypochlorite, chlorine trifluoride, chromic acid, chromium trioxide (chromic anhydride), magnesium peroxide, dibenzoyl peroxide, sodium peroxide, dinitrogen trioxide, fluorine, perchloric acid, potassium bromate, potassium chlorate, potassium peroxide, propyl nitrate, sodium chlorate, sodium chlorite, and sodium perchlorate.

12. The process of claim 1, further comprising removing the metal from the top of the substrate after etching the substrate.

13. The process of claim 1, further comprising forming a polycrystalline silicon nanostructure produced by the process into a lithium ion battery anode.

14. The process of claim 1, further comprising forming an optoelectronic device including a polycrystalline silicon nanostructure produced by the process.

15. The process of claim 1, further comprising forming a photovoltaic cell including a polycrystalline silicon nanostructure produced by the process.

* * * * *